United States Patent
Gong et al.

(10) Patent No.: US 11,881,254 B2
(45) Date of Patent: *Jan. 23, 2024

(54) ENABLE CONTROL CIRCUIT AND SEMICONDUCTOR MEMORY

(71) Applicant: CHANGXIN MEMORY TECHNOLOGIES, INC., Hefei (CN)

(72) Inventors: Yuanyuan Gong, Hefei (CN); Zhan Ying, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 16 days.

This patent is subject to a terminal disclaimer.

(21) Appl. No.: 17/669,532

(22) Filed: Feb. 11, 2022

(65) Prior Publication Data
US 2023/0020561 A1    Jan. 19, 2023

Related U.S. Application Data

(63) Continuation of application No. PCT/CN2021/117050, filed on Sep. 7, 2021.

(30) Foreign Application Priority Data

Jul. 9, 2021    (CN) .......................... 202110778540.2

(51) Int. Cl.
*G11C 11/4093*    (2006.01)
*G11C 11/4076*    (2006.01)
*H03K 19/00*    (2006.01)

(52) U.S. Cl.
CPC ...... *G11C 11/4093* (2013.01); *G11C 11/4076* (2013.01); *H03K 19/0005* (2013.01)

(58) Field of Classification Search
CPC ....... G11C 7/10; G11C 7/1051; G11C 7/1057; G11C 7/1066; G11C 7/1078;
(Continued)

(56) References Cited

U.S. PATENT DOCUMENTS 7,688,671 B2    3/2010    Hosoe
7,816,941 B2    10/2010   Kim
(Continued)

FOREIGN PATENT DOCUMENTS

CN    1953095 A      4/2007
CN    101425325 A    5/2009
(Continued)

*Primary Examiner* — Seokjin Kim
(74) *Attorney, Agent, or Firm* — Cooper Legal Group, LLC

(57) ABSTRACT

An enable control circuit and a semiconductor memory are provided. The enable control circuit includes: a counting circuit, configured to: count past clock cycles, and determine a clock cycle count value; a selection circuit, configured to determine a target clock cycle count value according to a first config signal; and a control circuit, connected to the counting circuit and the selection circuit, and configured to: control an On Die Termination (ODT) path to be in an enabled state responsive to a level state of an ODT pin signal being inverted, and start the counting circuit; and control the ODT path to switch from the enabled state to a disabled state when the clock cycle count value reaches the target clock cycle count value.

19 Claims, 9 Drawing Sheets

(58) Field of Classification Search
CPC . G11C 7/1084; G11C 7/1093; G11C 11/4076; G11C 11/4093; H03K 19/0005
See application file for complete search history.

(56) References Cited

U.S. PATENT DOCUMENTS

| | | | |
|---|---|---|---|
| 8,363,508 | B2 | 1/2013 | Fujisawa |
| 8,436,641 | B2 | 5/2013 | Song |
| 10,141,935 | B2 | 11/2018 | Bains |
| 10,680,613 | B2 | 6/2020 | Bains |
| 11,632,113 | B2 * | 4/2023 | Gong ..................... H03K 21/38 377/107 |
| 2007/0103188 | A1 | 5/2007 | Hosoe |
| 2009/0115450 | A1 * | 5/2009 | Kim ..................... G11C 7/1057 326/30 |
| 2009/0222637 | A1 * | 9/2009 | Kim ..................... G11C 5/063 711/E12.001 |
| 2010/0202180 | A1 * | 8/2010 | Kim ..................... G11C 11/4093 365/191 |
| 2011/0058442 | A1 * | 3/2011 | Fujisawa ................ G11C 5/063 365/236 |
| 2012/0081144 | A1 * | 4/2012 | Song ..................... G11C 7/222 326/30 |
| 2017/0093400 | A1 | 3/2017 | Bains et al. |
| 2019/0036531 | A1 | 1/2019 | Bains et al. |
| 2019/0392886 | A1 * | 12/2019 | Cox ..................... G11C 11/4072 |

FOREIGN PATENT DOCUMENTS

| | | |
|---|---|---|
| CN | 101800075 A | 8/2010 |
| CN | 102446546 A | 5/2012 |
| CN | 107452420 A | 12/2017 |
| CN | 107924693 A | 4/2018 |
| JP | 2011060372 A | 3/2011 |

* cited by examiner

ENABLE CONTROL CIRCUIT AND SEMICONDUCTOR MEMORY

CROSS-REFERENCE TO RELATED APPLICATIONS

This is a continuation of International Application No. PCT/CN2021/117050, filed on Sep. 7, 2021, which claims priority to Chinese patent application No. 202110778540.2, filed on Jul. 9, 2021 and entitled "ENABLE CONTROL CIRCUIT AND SEMICONDUCTOR MEMORY". The contents of International Application No. PCT/CN2021/117050 and Chinese patent application No. 202110778540.2 are hereby incorporated by reference in their entireties.

TECHNICAL FIELD

The disclosure relates to, but not limited to, an enable control circuit and a semiconductor memory.

BACKGROUND

With the continuous development of semiconductor technologies, when manufacturing and using computers and other devices people have increasing demands on the speed of data transmission. To obtain a faster data transmission speed, a series of memories and other devices that can transmit data at a Double Data Rate (DDR) have emerged.

The regulation regarding On Die Termination (ODT) has been added to the design of DDR data transmission. In brief, a Termination Resistor (RTT) has switchable resistance values. How to switch the resistance values needs to follow particular timing. For example, a value of the RTT may be controlled by using a state of an ODT pin on a memory chip.

However, at present, an enabled state of an ODT path cannot be accurately controlled in the related art, resulting in a waste of current and increased power consumption.

SUMMARY

According to a first aspect, an embodiment of the disclosure provides an enable control circuit, including:

a counting circuit, configured to: count past clock cycles, and determine a clock cycle count value;

a selection circuit, configured to determine a target clock cycle count value according to a first config signal; and a control circuit, connected to the counting circuit and the selection circuit, and configured to: control an ODT path to be in an enabled state responsive to a level state of an ODT pin signal being inverted, and start the counting circuit; and control the ODT path to switch from the enabled state to a disabled state when the clock cycle count value reaches the target clock cycle count value.

According to a second aspect, an embodiment of the disclosure provides a semiconductor memory, which includes the enable control circuit of the first aspect.

DETAILED DESCRIPTION

The following clearly and completely describes the technical solutions in embodiments of the disclosure with reference to the drawings in the embodiments of the disclosure. It may be understood that the specific embodiments described herein are only used to explain the disclosure but are not used to limit the disclosure. In addition, it needs to be noted that only parts related to the disclosure are shown in the accompanying drawings for ease of description.

Unless otherwise defined, the technical terms and scientific terms used herein have the same meanings as how they are generally understood by a person skilled in the art to which the disclosure pertains. The terms used herein are merely used for describing the embodiments of the disclosure, but are not intended to limit the disclosure.

In the following description, reference is made to "some embodiments", which describes a subset of all possible embodiments, but it may be understood that "some embodiments" may be the same subset or a different subset of all possible embodiments, and may be combined with each other without conflict.

It needs to noted that references to the terms "first, second, and third" in the embodiments of the disclosure are only to distinguish similar objects and do not represent a specific order of objects, but rather the terms "first, second, and third" are used to interchange specific orders or sequences, where appropriate, to enable embodiments of the disclosure described herein to be practiced in an order other than the order shown or described herein.

Before the embodiments of the disclosure is further described in detail, the terms and phrases in the embodiments of the disclosure are first described, and the terms and phrases in the embodiments of the disclosure are subject to the following interpretation.

Dynamic Random Access Memory (DRAM)
Double Data Rate (DDR)
4th DDR (DDR4)
On Die Termination (ODT)
Termination Resistance (RTT)
Column address Write Latency (CAS Write Latency, CWL)
Memory access data latency (CAS Latency, CL)
Additive Latency (AL)
Parity Latency (PL)
Delay-Locked Loop (DLL)
Mode Register (MR)
Mode Register Set (MRS)

With the rapid development of semiconductor processes, a transmission rate of signals becomes increasingly high, and as a result it becomes increasingly challenging to ensure the integrity of signals. During the high-speed propagation of signals, ODT resistors are added separately in the designs of DDR3 and DDR4 to better improve the signal integrity of data. That is, an ODT resistor is used to perform impedance matching on a transmission cable to reduce energy loss and reflection of signals in a transmission process, so that the integrity of a signal received by a receive end can be ensured.

Figure 1:
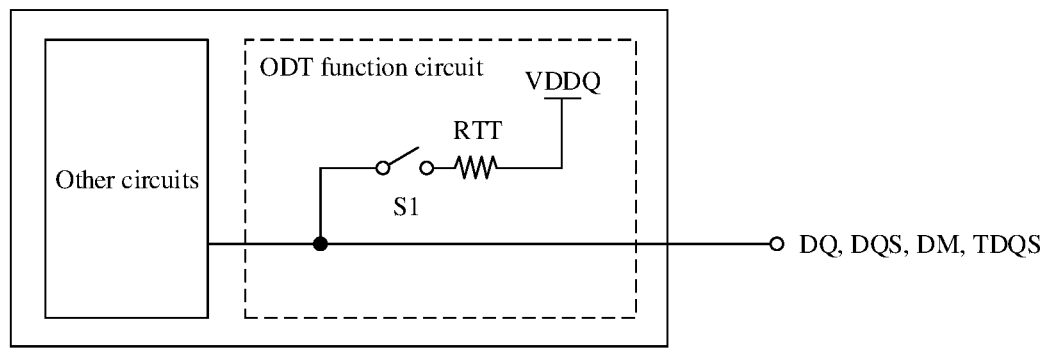
FIG. 1 is a schematic structural diagram of an ODT function circuit in the related art.

A DDR4 DRAM is used as an example. The DDR4 DRAM supports an ODT function. The function may set a default resistance value by using ODT pin control, a write command or an MR to adjust RTTs of DQ, DQS_t/c, DM_n, and TDQS_t/c ports of each device. In addition, the objective of the ODT function is to reduce reflection, a controller is independently used to control RTTs of all DRAMs or an RTT of any DRAM to effectively improve signal integrity on a memory interface. FIG. 1 is a schematic structural diagram of an ODT function circuit in the related art. In FIG. 1, the ODT function circuit may at least include a switch S1, an RTT, and a power source VDDQ. One end of the switch S1 is connected to one end of the RTT. The other end of the RTT is connected to the power source VDDQ. The other end of the switch S1 is connected to other circuitry like and DQ, DQS, DM, and TDQS ports. It needs to be noted that, DQS may be a pair of differential data strobe signals DQS_t and DQS_c. TDQS may be a pair of differential data strobe signals TDQS_t and TDQS_c. In other words, the DDR4 DRAM only supports a data strobe signal which is a differential signal but does not support a data strobe signal which is a single signal.

In addition, the switch S1 in FIG. 1 is controlled by an ODT control logic. The ODT control logic includes an external ODT pin input, an MR configuration, and other control information. The value of the RTT is controlled by configuration information in the MR. In addition, if in a self-refresh mode or after RTT_NOM is disabled by MR1 {A10, A9, A8}={0, 0, 0}, the control of an ODT pin is ignored.

Specifically, an ODT function of the DDR4 DRAM has a total of four states: RTT disabled, RTT_WR, RTT_NOM, and RTT_PARK. When configuration bits such as MR1 {A10, A9, A8}, MR2 {A10:A9}, and MR5 {A8:A6} are not all zeros, the ODT function is enabled. In this case, an actual value of an ODT resistance is determined by these configuration bits. After entering the self-refresh mode, the DDR4 DRAM automatically disables the ODT function, and all RTTs are set to a high resistance (Hi-Z) state to discard all MRSs.

It further needs to be noted that, the embodiments of the disclosure provide a synchronous ODT mode. When a DLL is turned on and locked, the synchronous ODT mode may be selected. In the synchronous ODT mode, after DODTLon clock cycles after an ODT pin signal turns into a high level and is sampled by a first clock rising edge, RTT_NOM is turned on. After DODTLoff clock cycles after the ODT pin signal turns into a low level and is sampled by the first clock rising edge, RTT_NOM is turned off. The two parameters DODTLon and DODTLoff are related to WL (WL=CWL+AL+PL), where DODTLon=WL−2, and DODTLoff=WL−2.

In the synchronous ODT mode, the AL and the PL also directly affect a latency (which may also be referred to as a "delay") of ODT. Details are shown in Table 1.

TABLE 1

| Symbol | Parameter | DDR4—1600/1866/2133/2400/2666/3200 | Unit |
|---|---|---|---|
| DODTLon | Directly affect ODT turn on latency | CWL + AL + PL − 2.0 | Clock cycle/tck |
| DODTLoff | Directly affect ODT turn off latency | CWL + AL + PL − 2.0 | Clock cycle/tck |

Figure 2:
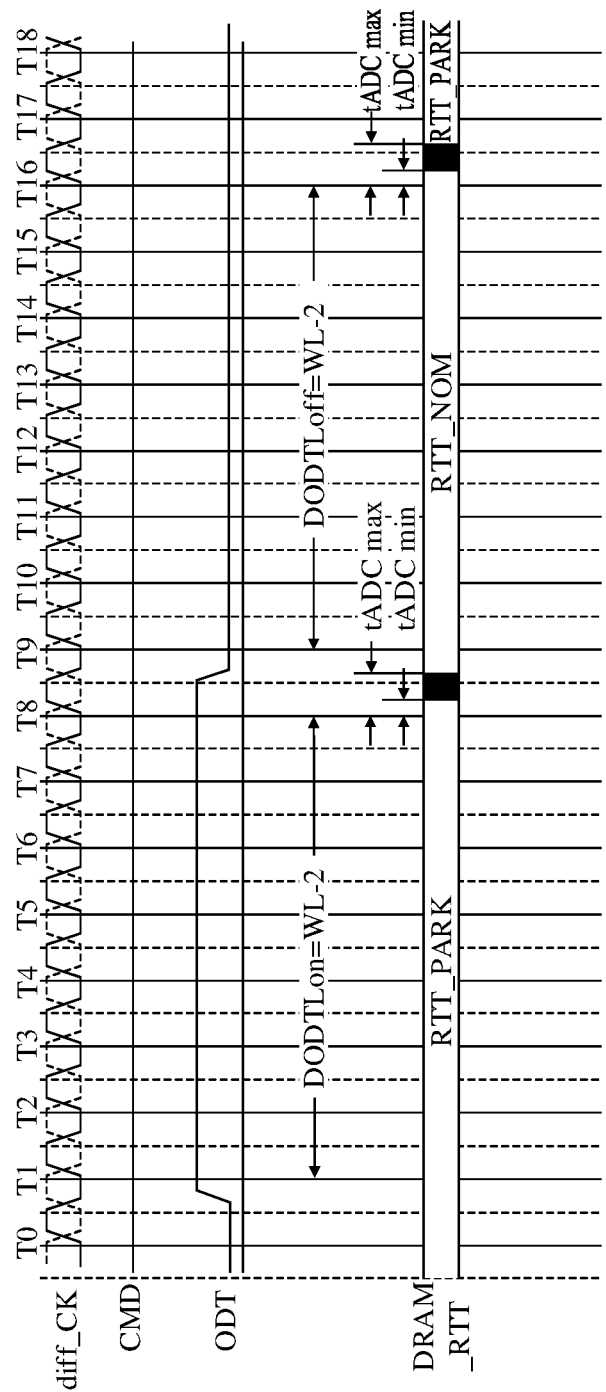
FIG. 2 is a schematic timing diagram in a synchronous ODT mode in the related art.

Further, in the synchronous ODT mode, the following timing parameters are all applicable: DODTLon, DODTLoff, tADC min, tADC max, and the like. When the value of the ODT resistance is changed, for example, is switched from RTT_PARK to RTT_NOM, in this case, a maximum value and a minimum value of an RTT change time jitter value are respectively tADC max and tADC min. These parameters are applicable to the synchronous ODT mode and a data RTT disabled mode. For example, FIG. 2 is a schematic timing diagram of a synchronous ODT mode in the related art. As shown in FIG. 2, assuming that CWL=9, AL=0, and PL=0, then DODTLon=WL−2=7, and DODTLoff=WL−2=7. In addition, a black part in FIG. 2 is the RTT change time jitter value.

It may be understood that the foregoing content is the related regulation for ODT in the technical specifications of DDR4. In brief, the resistance value of an RTT is switchable, but how to perform switching needs to follow particular timing. One of the modes is a synchronous ODT mode. That is, a resistance value of the RTT is controlled by a signal level state at an ODT pin on a DRAM chip. When the signal level state at the ODT pin changes from a low level to a high level, after a wait of DODTLon clock cycles, the resistance value of the RTT of the DRAM chip changes from RTT_PARK to RTT_NOM. Alternatively, when the signal level state at the ODT pin changes from a high level to a low level, after a wait of DODTLoff clock cycles, the resistance value of the RTT of the DRAM chip changes from RTT_NOM to RTT_PARK.

It needs to be noted that, the timing DODTLon and DODTLoff, that is, an ODT latency, is related to the values of the CWL, the AL, and the PL. Therefore, on an ODT path, a shift register needs to be set to shift a plurality of clock cycles, to implement a timing requirement related to the CWL, the AL, and the PL. In addition, the shift register requires a clock signal (represented by CLK).

Figure 3:
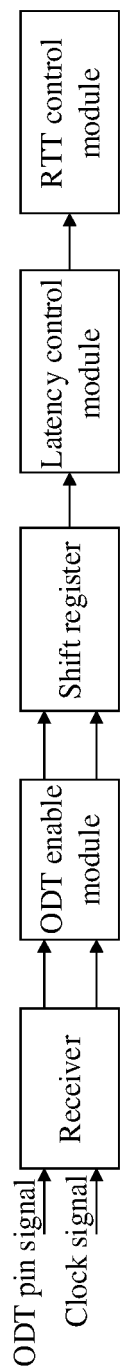
FIG. 3 is a block diagram for controlling the operation of an ODT path according to an embodiment of the disclosure.

FIG. 3 is a block diagram for controlling the operation of an ODT path according to an embodiment of the disclosure. In FIG. 3, a receiver, an ODT enable module, a shift register, a latency control module, and an RTT control module may be included. The function of the receiver is to receive an ODT pin signal and a clock signal. The RTT control module is configured to control switching of resistance values of an RTT. In addition, the entire ODT path is a very complex path. The ODT path includes a physical delay (not related to a clock cycle) and a clock delay (the delay is an integer multiple of the clock cycle). In FIG. 3, a delay of the entire path eventually needs to be an integer multiple of the clock cycle, that is, DODTLon and DODTLoff. Therefore, the effect of the latency control module is to use the DLL to implement the synchronization between a signal at an end of the ODT path (that is, a control signal of the switch S1 in FIG. 1) and the clock signal. In this way, the delay of the entire path becomes an integer multiple of the clock cycle by compensating for the physical delay, so that the control of the resistance values of the RTT can be eventually implemented.

In the related art, the ODT enable module mainly uses simple logical control. As shown in Table 2, by identifying whether the synchronous ODT mode is enabled in an MRS setting, the CLK used for the ODT path is controlled to be enabled or disabled. For example, if MR1<A10:A8> is set to a disabled state, in this case, the signal level state at the ODT pin does not function, and the ODT path and CLK are not required. Therefore, the CLK can be disabled, and the ODT path is also disabled, so that power saving can be implemented.

However, as shown in Table 2, there is still a case at present. The MRS setting is in an enabled state, but the signal level state at the ODT pin does not change. In this case, the operation of the ODT path is also not required. However, because CLK is not disabled, a waste of current is caused, and power consumption is increased.

TABLE 2

| RTT_PARK<br>MR5<br>{A8:A6} | RTT_NOM<br>MR1<br>{A10:A9:A8} | ODT<br>pin | DRAM<br>termination<br>state |
|---|---|---|---|
| Enabled | Enabled | High | RTT_NOM |
|  |  | Low | RTT_PARK |
|  | Disabled | Not working | RTT_PARK |
| Disabled | Enabled | High | RTT_NOM |
|  |  | Low | Hi-Z |
|  | Disabled | Not working | Hi-Z |

Based on this, an embodiment of the disclosure provides an enable control circuit, it can be implemented that an ODT path is enabled and maintains at the enabled state for a particular time period (that is, the ODT path is in an enabled state) after it is detected that a level state of an ODT pin is changed. In addition, after it is ensured that the resistance value of the RTT has changed, the ODT path may be disabled, so that power saving can be implemented.

The embodiments of the disclosure are described below in detail with reference to the drawings.

Figure 4:
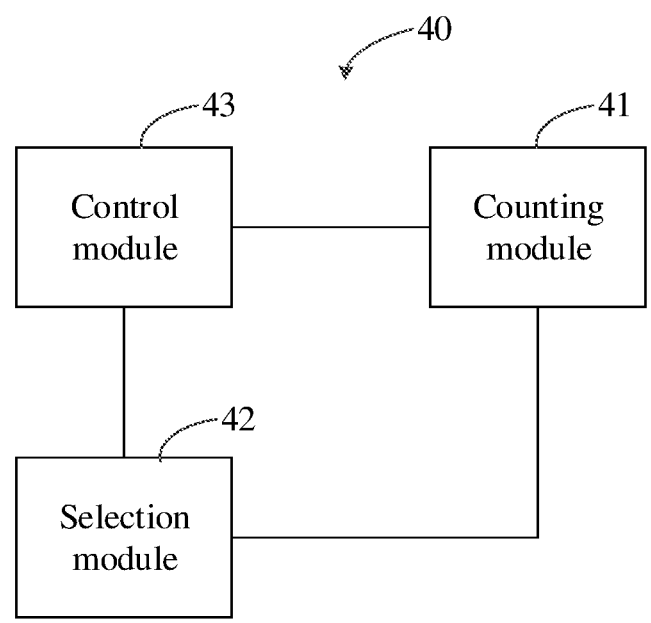
FIG. 4 is a schematic structural diagram of an enable control circuit according to an embodiment of the disclosure.

In an embodiment of the disclosure, FIG. 4 is a schematic structural diagram of an enable control circuit 40 according to an embodiment of the disclosure. As shown in FIG. 4, the enable control circuit 40 may include a counting module 41, a selection module 42, and a control module 43.

The counting module 41 is configured to: count past clock cycles, and determine a clock cycle count value.

The selection module 42 is configured to determine a target clock cycle count value according to a first config signal.

The control module 43 is connected to the counting module 41 and the selection module 42, and is configured to: control an ODT path to be in an enabled state responsive to a level state of an ODT pin signal being inverted, and start the counting module 41; and control the ODT path to switch from the enabled state to a disabled state when the clock cycle count value reaches the target clock cycle count value.

It needs to be noted that, the enable control circuit 40 in the embodiments of the disclosure is applied to the ODT enable module in FIG. 3. Herein, if the signal level state at the ODT pin is inverted, for example, is switched from a low level to a high level, or is switched from a high level to a low level, the resistance value of the RTT changes after a latency of DODTLon or DODTLoff clock cycles. In the process, the ODT path needs to be controlled to be in the enabled state; and then after the resistance value of the RTT has changed, to reduce power consumption, in this case, the ODT path may be further controlled to switch from the enabled state to the disabled state.

It further needs to be noted that, to ensure that the resistance value of the RTT has changed, the embodiments of the disclosure may set one target clock cycle count value. The target clock cycle count value is related to DODTLon or DODTLoff. Because DODTLon and DODTLoff are both related to the CWL, the AL, and the PL. That is, the setting of the target clock cycle count value is related to the CWL, the AL, and the PL. In the embodiments of the disclosure, the first config signal is generated according to whether the AL and/or the PL is turned on, so that the selection module 42 may determine the target clock cycle count value according to whether the AL and/or the PL is turned on.

In this way, the counting module 41 may determine whether the clock cycle count value reaches the target clock cycle count value, the selection module 42 may determine the target clock cycle count value, and then the control module 43 may control the ODT path to be in the enabled state responsive to the level state of the ODT pin signal being inverted and start the counting module; and control the ODT path to switch from the enabled state to the disabled state when the clock cycle count value reaches the target clock cycle count value, so that power consumption can be reduced.

Figure 5:
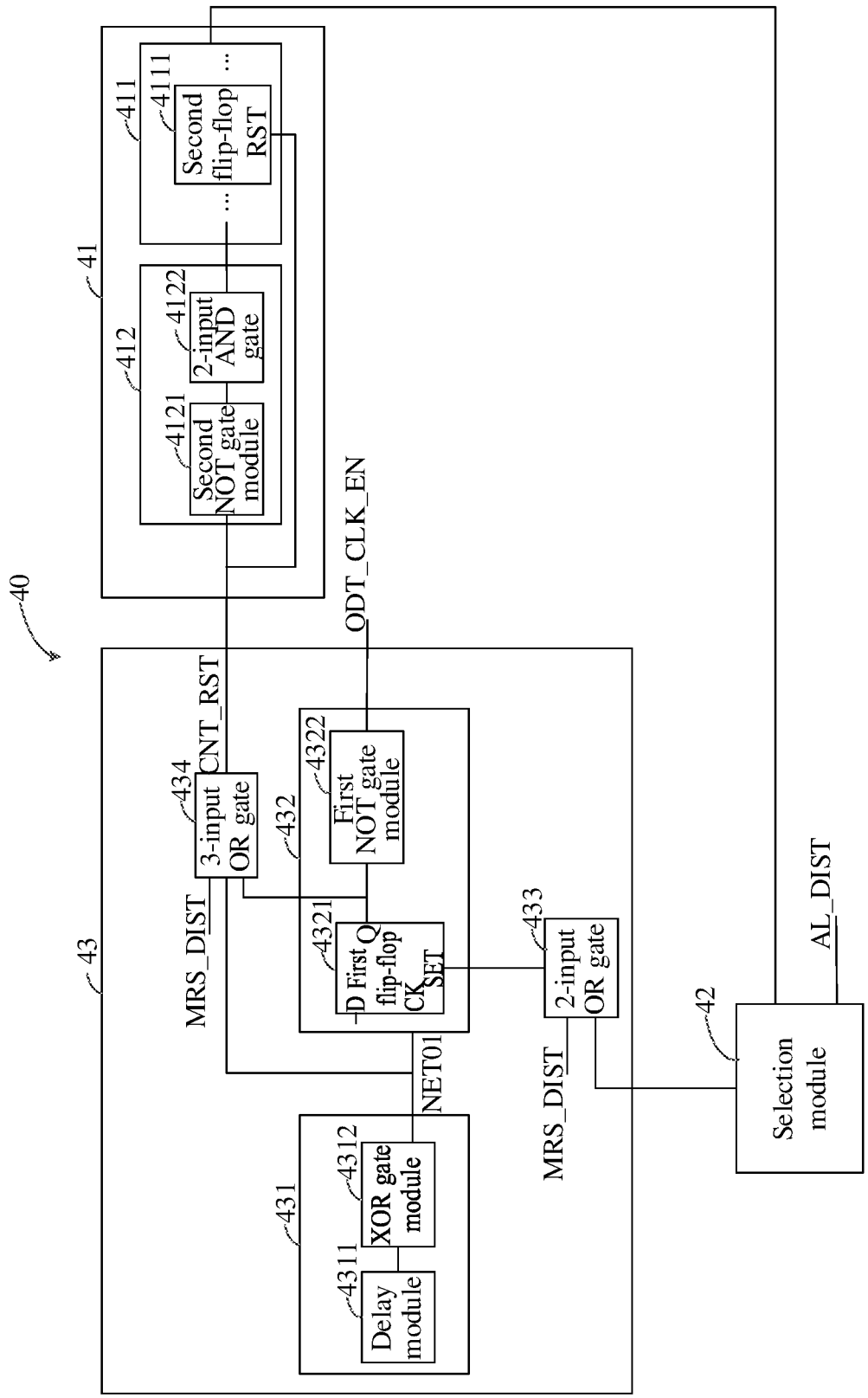
FIG. 5 is a schematic structural diagram of another enable control circuit according to an embodiment of the disclosure.

In some embodiments, based on the enable control circuit 40 shown in FIG. 4, referring to FIG. 5, the control module 43 may include a first control submodule 431 and a second control submodule 432.

The first control submodule 431 is configured to generate a first intermediate signal according to the ODT pin signal.

The second control submodule 432 is configured to perform a logical operation on the first intermediate signal to generate an ODT enable signal.

Herein, for the first intermediate signal, the first intermediate signal may be represented by NET01. The first intermediate signal may include: before the level state of the ODT pin signal is inverted, the first intermediate signal is at a first level; after the level state of the ODT pin signal is inverted, the first intermediate signal is switched from the first level to a second level and maintains at the second level for a preset time period; and after the preset time period, the first intermediate signal is switched from the second level to the first level.

For the ODT enable signal, the ODT enable signal may be represented by ODT_CLK_EN. The ODT enable signal may be configured to: control the ODT path to be in the enabled state when the ODT enable signal is at a third level; and control the ODT path to be in the disabled state when the ODT enable signal is at a fourth level.

In a specific example, the first level may be a low level, the second level may be a high level, the third level may be the high level, and the fourth level may be the low level.

Further, for the first control submodule 431, in some embodiments, as shown in FIG. 5, the first control submodule 431 may include a delay module 4311 and an XOR gate module 4312.

The delay module 4311 is configured to delay the ODT pin signal by the preset time period to obtain a delayed ODT signal.

The XOR gate module 4312 is configured to perform an XOR operation on the ODT pin signal and the delayed ODT signal to obtain the first intermediate signal.

Figure 6:
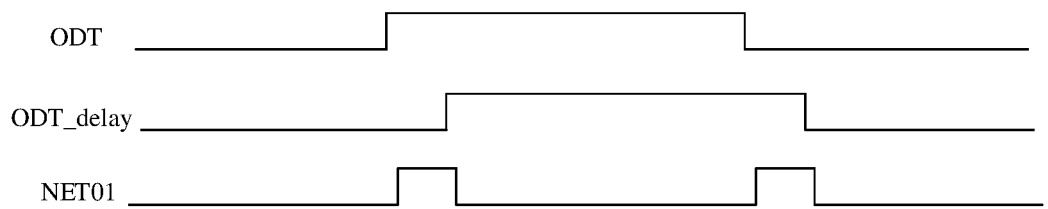
FIG. 6 is a schematic timing diagram of an ODT pin signal, a delayed ODT signal, and a first intermediate signal according to an embodiment of the disclosure.

Herein, the preset time period is a time by which the ODT pin signal is delayed by using the delay module 4311. In addition, the preset time period may also control a pulse width of the first intermediate signal. FIG. 6 is a schematic timing diagram of an ODT pin signal, a delayed ODT signal, and a first intermediate signal according to an embodiment of the disclosure. In FIG. 6, ODT indicates the ODT pin signal, ODT_delay indicates the delayed ODT signal, and NET01 indicates the first intermediate signal. As can be seen according to FIG. 6, before the level state of the ODT pin signal is inverted, the first intermediate signal is at a low level; after the level state of the ODT pin signal is inverted, the first intermediate signal is switched from a low level to a high level and maintains at the second level for a preset time period; and after the preset time period, the first intermediate signal is switched from a high level to a low level.

It needs to be noted that, due to a physical delay introduced by the XOR gate module 4312, a moment at which the level state of the ODT pin signal is inverted is not aligned with a moment at which the first intermediate signal is switched from a low level to a high level on a timeline.

Further, for the second control submodule 432, in some embodiments, as shown in FIG. 5, the second control submodule 432 may include a first flip-flop 4321 and a first NOT gate module 4322.

The first flip-flop 4321 is a Data Flip-Flop (or Delay Flip-Flop, DFF). Herein, the first flip-flop 4321 may include a clock terminal (CK), an input terminal (D), and an output terminal (Q). The clock terminal (CK) of the first flip-flop 4321 is connected to an output terminal of the first control submodule 431, and is configured to receive the first intermediate signal. The input terminal (D) of the first flip-flop 4321 is connected to a ground terminal. The output terminal (Q) of the first flip-flop 4321 is configured to output a second intermediate signal.

The first NOT gate module 4322 is configured to: receive the second intermediate signal, and perform a NOT operation on the second intermediate signal to obtain the ODT enable signal.

It needs to be noted that, for the first flip-flop 4321, the first flip-flop 4321 may further include a set terminal (SET).

The set terminal (SET) is configured to: receive a first set signal, and control the ODT enable signal to be at a low level by setting the first flip-flop 4321 when the first set signal is at a high level.

Herein, the ground terminal may be connected to a global ground signal, and is represented by VSS! The first set signal may be represented by SET.

It further needs to be noted that, the DFF is an information storage device that has a memory function and has two stable states, and is a fundamental logical unit for forming a plurality of timing circuits and also an important unit circuit in a digital logical circuit. The DFF has two stable states, that is, states "0" and "1". Under the effect of a particular external signal, the DFF may be inverted from a stable state to another stable state.

Specifically, the first flip-flop 4321 is a DFF. In the embodiments of the disclosure, the first flip-flop 4321 may include an input terminal (D), a clock terminal (CK), a set terminal (SET), and an output terminal (Q).

Further, for the first set signal, in some embodiments, as shown in FIG. 5, the control module 43 may further include a 2-input OR gate 433.

The selection module 42 is further configured to generate a target achievement signal, where the target achievement signal indicates that the clock cycle count value reaches the target clock cycle count value.

The 2-input OR gate 433 is configured to perform an OR operation on the target achievement signal and a second config signal to obtain the first set signal.

Herein, the second config signal is generated according to a setting of an MR. The second config signal may be represented by MRS_DIST. The second config signal may be configured to: indicate that an ODT function of a chip is disabled when the second config signal is at a fifth level; and indicate that the ODT function of the chip is enabled when the second config signal is at a sixth level.

In a specific example, the fifth level is a high level, and the sixth level is a low level.

That is, if the second config signal is at a high level, it indicates that the ODT function of the chip is disabled. In this case, it is no longer necessary to execute the enable control circuit 40 of the disclosure. If the second config signal is at a low level, it indicates that the ODT function of the chip is enabled, and an ODT pin signal further needs to be used in combination to determine whether to enable the ODT path.

It further needs to be noted that, if the second config signal is at a high level, it may be determined that the first set signal is at a high level. In this way, when the first set signal is at a high level, the first flip-flop may be set, so that the ODT enable signal is controlled to be at a low level, to enable the ODT path to be in a disabled state.

Further, in some embodiments, as shown in FIG. 5, the control module 43 may further include a 3-input OR gate 434.

The 3-input OR gate 434 is configured to perform an OR operation on the second config signal, the first intermediate signal, and the second intermediate signal to generate a counting reset signal.

Herein, the counting reset signal may be represented by CNT_RST. After the counting reset signal is obtained, the counting reset signal may be inputted into the counting module 41. In one aspect, the counting reset signal may be directly used for performing a resetting operation on the counting module 41. In another aspect, after the logical operation is performed on the counting reset signal, a clock signal of the counting module 41 may further be blocked.

Further, in some embodiments, as shown in FIG. 5, the counting module 41 may include an asynchronous binary counter 411.

In a specific example, the asynchronous binary counter 411 may include a plurality of second flip-flops 4111, and the plurality of second flip-flops 4111 are connected in sequence.

In the embodiments of the disclosure, each second flip-flop 4111 is a DFF, an input terminal (D) of each second flip-flop is connected to a second output terminal (represented by Q-NON, or QN) of the second flip-flop, and the second output terminal (Q-NON) of the second flip-flop is connected to a clock terminal (CK) of a next second flip-flop.

In addition, the second flip-flop 4111 may further include a first output terminal (Q) and a reset terminal (RST).

The first output terminal (Q) of the second flip-flop is configured to output a counting signal.

The reset terminal (RST) of the second flip-flop is configured to: receive the counting reset signal, and control the counting signal to be at a low level by resetting the second flip-flop when the counting reset signal is at a high level.

Specifically, the second flip-flop 4111 is also a DFF. In the embodiments of the disclosure, the second flip-flop 4111 may include an input terminal (D), a clock terminal (CK), a reset terminal (RST), a first output terminal (Q), and a second output terminal (Q-NON), or even may also include a set terminal (SET). Herein, the set terminal may be connected to a ground terminal. In a specific example, the set terminal (SET) of the second flip-flop is configured to receive a second set signal. The second set signal may be a global ground signal, and is represented by VSS!.

Further, in some embodiments, as shown in FIG. 5, the counting module 41 may further include a clock control module 412.

The clock control module 412 is configured to: receive the counting reset signal and a clock signal, and generate an internal clock signal.

Herein, the internal clock signal is connected to a clock terminal (CK) of a first second flip-flop in the plurality of second flip-flops, and is configured to provide the clock signal to the counting module 41. The internal clock signal may configured to: stop outputting the internal clock signal when the counting reset signal is at a seventh level; and output the internal clock signal when the counting reset signal is at an eighth level.

In a specific example, the seventh level is a high level, and the eighth level is a low level.

Further, for the clock control module 412, in some embodiments, as shown in FIG. 5, the clock control module 412 may include a second NOT gate module 4121 and a 2-input AND gate 4122.

The second NOT gate module 4121 is configured to: receive the counting reset signal, and perform a NOT operation on the counting reset signal to obtain a third intermediate signal.

The 2-input AND gate 4122 is configured to: receive the third intermediate signal and the clock signal, and perform an AND operation on the third intermediate signal and the clock signal to obtain the internal clock signal.

It needs to be noted that, because the counting reset signal is related to the second config signal. In this way, if the second config signal is at a high level, it may be determined that the counting reset signal is at a high level. In this way, when the counting reset signal is at a high level, the asynchronous binary counter 411 may be disabled, thereby achieving a technical effect of reducing current.

It further needs to be noted that, the internal clock signal used in the counting module 41 is also controlled by the counting reset signal. In this way, after counting ends, because the counting reset signal is at a high level, the internal clock signal used by the counting module is also disabled, so that current can be further reduced.

Further, in some embodiments, the selection module 42 is further configured to: receive the first config signal and at least two indication signals, and select one of the at least two indication signals as the target achievement signal according to the first config signal, where the at least two indication signals indicate that the clock cycle count value reaches different target clock cycle count values respectively.

Herein, for the selection module 42, the first config signal may be generated according to whether the AL and/or the PL is turned on. The first config signal is represented by AL_DIST. The first config signal is separately described below by using four cases: neither the AL nor the PL is turned on, both the AL and the PL are turned on, the AL is turned on and the PL is not turned on, and the PL is turned on and the AL is not turned on.

In a possible implementation, the selection module 42 is specifically configured to: responsive to that the first config signal indicates that neither an AL nor a PL is turned on, select a first indication signal as the target achievement signal and determine that the target clock cycle count value is a first value, where the first value is greater than or equal to a value obtained by subtracting 2 from a CWL.

In another possible implementation, the selection module 42 is specifically configured to: responsive to that the first config signal indicates that both the AL and the PL are turned on, select a second indication signal as the target achievement signal and determine that the target clock cycle count value is a second value, where the second value is greater than or equal to a value obtained by subtracting 2 from a sum of the CWL, the AL, and the PL.

In still another possible implementation, the selection module 42 is specifically configured to: responsive to that the first config signal indicates that the AL is turned on and the PL is not turned on, select a third indication signal as the target achievement signal and determine that the target clock cycle count value is a third value, where the third value is greater than or equal to a value obtained by subtracting 2 from a sum of the CWL and the AL.

In yet another possible implementation, the selection module 42 is specifically configured to: responsive to that the first config signal indicates that the PL is turned on and the AL is not turned on, select a fourth indication signal as the target achievement signal and determine that the target clock cycle count value is a fourth value, where the fourth value is greater than or equal to a value obtained by subtracting 2 from a sum of the CWL and the PL.

Herein, the first indication signal represents that the clock cycle count value reaches the first value, the second indication signal represents that the clock cycle count value reaches the second value, the third indication signal represents that the clock cycle count value reaches the third value, and the fourth indication signal represents that the clock cycle count value reaches the fourth value.

It further needs to be noted that, for the value of the CWL, details are shown in Table 3. It can be seen from Table 3 that the maximum value of the CWL is 20. For the value of the AL, details are shown in Table 4. It can be seen from Table 4 that the maximum value of the AL is CL−1. For the value of the CL, details are shown in Table 5. It can be seen from Table 5 that the maximum value of the CL is 32. In this case, the maximum value of the AL is 31. For the value of the PL, details are shown in Table 6. It can be seen from Table 6 that the maximum value of the PL is 8.

TABLE 3

| | | | | Operating Data Rate in MT/s for 1 tCK Write Preamble | | Operating Data Rate in MT/s for 1 tCK Write Preamble | |
|---|---|---|---|---|---|---|---|
| A5 | A4 | A3 | CWL | 1st Set | 2nd Set | 1st Set | 2nd Set |
| 0 | 0 | 0 | 9 | 1600 | | | |
| 0 | 0 | 1 | 10 | 1866 | | | |
| 0 | 1 | 0 | 11 | 2133 | 1600 | | |
| 0 | 1 | 1 | 12 | 2400 | 1866 | | |
| 1 | 0 | 0 | 14 | 2666 | 2133 | 2400 | |
| 1 | 0 | 1 | 16 | 2933/3200 | 2400 | 2666 | 2400 |
| 1 | 1 | 0 | 18 | | 2666 | 2933/3200 | 2666 |
| 1 | 1 | 1 | 20 | | 2933/3200 | | 2933/3200 |

TABLE 4

| A4, A3 | (AL) | |
|---|---|---|
| | | 00 = 0 (AL disabled) |
| | | 01 = CL − 1 |
| | | 10 = CL − 2 |
| | | 11 = Reserved |

TABLE 5

| A12 | A6 | A5 | A4 | A2 | CL |
|---|---|---|---|---|---|
| 0 | 0 | 0 | 0 | 0 | 9 |
| 0 | 0 | 0 | 0 | 1 | 10 |
| 0 | 0 | 0 | 1 | 0 | 11 |
| 0 | 0 | 0 | 1 | 1 | 12 |
| 0 | 0 | 1 | 0 | 0 | 13 |
| 0 | 0 | 1 | 0 | 1 | 14 |
| 0 | 0 | 1 | 1 | 0 | 15 |
| 0 | 0 | 1 | 1 | 1 | 16 |
| 0 | 1 | 0 | 0 | 0 | 18 |
| 0 | 1 | 0 | 0 | 1 | 20 |
| 0 | 1 | 0 | 1 | 0 | 22 |
| 0 | 1 | 0 | 1 | 1 | 24 |
| 0 | 1 | 1 | 0 | 0 | 23 |
| 0 | 1 | 1 | 0 | 1 | 17 |
| 0 | 1 | 1 | 1 | 0 | 19 |
| 0 | 1 | 1 | 1 | 1 | 21 |
| 1 | 0 | 0 | 0 | 0 | 25 (only 3 DS available) |
| 1 | 0 | 0 | 0 | 1 | 26 |
| 1 | 0 | 0 | 1 | 0 | 27 (only 3 DS available) |
| 1 | 0 | 0 | 1 | 1 | 28 |
| 1 | 0 | 1 | 0 | 0 | Reserved for 29 |
| 1 | 0 | 1 | 0 | 1 | 30 |
| 1 | 0 | 1 | 1 | 0 | Reserved for 31 |
| 1 | 0 | 1 | 1 | 1 | 32 |
| 1 | 1 | 0 | 0 | 0 | Reserved |

TABLE 6

| A2 | A1 | A0 | PL | Speed Bin |
|---|---|---|---|---|
| 0 | 0 | 0 | Disable | |
| 0 | 0 | 1 | 4 | 1600, 1866, 2133 |
| 0 | 1 | 0 | 5 | 2400, 2666 |
| 0 | 1 | 1 | 6 | 2933, 3200 |
| 1 | 0 | 0 | 8 | RFU |
| 1 | 0 | 1 | Reserved | |
| 1 | 1 | 0 | Reserved | |
| 1 | 1 | 1 | Reserved | |

It needs to be noted that, Table 3 to Table 6 above come from related standard documents of the DDR4 DRAM. Where A0, A1, A2, A3, A4, A5, A6, and A12 are bits in a corresponding MR. According to Table 3 to Table 6, it may be obtained that the maximum value of the CWL is 20, the maximum value of the AL is 31, and the maximum value of the PL is 8. In this case, according to the selection module 42, when the first config signal indicates that neither the AL nor the PL is turned on, in this case, the first value is a value greater than or equal to 18. When the first config signal indicates that both the AL and the PL are turned on, in this case, the second value is a value greater than or equal to 57. When the first config signal indicates that the AL is turned on and the PL is not turned on, in this case, the third value is a value greater than or equal to 49. When the first config signal indicates that the PL is turned on and the AL is not turned on, in this case, the fourth value is a value greater than or equal to 26. In this way, the target clock cycle count value may be determined.

In brief, this embodiment provides an enable control circuit. The enable control circuit includes a counting module, a selection module, and a control module. The counting module is configured to: count past clock cycles, and determine a clock cycle count value. The selection module is configured to determine a target clock cycle count value according to a first config signal. The control module is connected to the counting module and the selection module, and is configured to: control an ODT path to be in an enabled state responsive to a level state of an ODT pin signal being inverted, and start the counting module; and control the ODT path to switch from the enabled state to a disabled state when the clock cycle count value reaches the target clock cycle count value. In this way, an enabled state of the ODT path is controlled according to whether the clock cycle count value reaches the target clock cycle count value, it can be implemented that after it is detected that a level state of an ODT pin is changed, the ODT path is enabled and maintains at the enabled state for a particular time period (that is, the ODT path is in an enabled state). That is, the ODT path is in the enabled state. After it is ensured that the resistance value of the RTT has changed, the ODT path may be further disabled, so that current can be reduced, thereby reducing power consumption.

In another embodiment of the disclosure, with reference to FIG. 5, for example, the counting module 41 includes six second flip-flops, and the selection module 42 only receives two indication signals. In addition, the two indication signals are counting signals outputted by a fifth second flip-flop of the six second flip-flops and a sixth second flip-flop of the six second flip-flops respectively.

In some embodiments, the counting module 41 may include six second flip-flops, and the six second flip-flops are connected in sequence.

A first output terminal (Q) of an $i^{th}$ second flip-flop of the six second flip-flops is configured to output an $i^{th}$ counting signal, where i is an integer greater than 0 and less than or equal to 6.

The selection module 42 is specifically configured to: receive the first config signal, a fifth counting signal, and a sixth counting signal, and perform selection on the fifth counting signal and the sixth counting signal according to the first config signal to generate the target achievement signal, where two input terminals of the selection module are respectively connected to a first output terminal (Q) of a fifth second flip-flop of the six second flip-flops and a first output terminal (Q) of a sixth second flip-flop of the six second flip-flops.

It needs to be noted that, the $i^{th}$ counting signal of the six second flip-flops is represented by Q<i>. Specifically, the fifth counting signal may be represented by Q<5>, and is outputted by the first output terminal (Q) of the fifth second flip-flop. The sixth counting signal may be represented by Q<6>, and is outputted by the first output terminal (Q) of the sixth second flip-flop.

It further needs to be noted that, because the selection module 42 only receives two indication signals (the fifth counting signal and the sixth counting signal), in this case, the first config signal indicates that neither the AL nor the PL is turned on or indicates that at least one of the AL and the PL is turned on. In this way, in a specific example, the selection module 42 is further configured to: responsive to that the first config signal indicates that neither the AL nor the PL is turned on, determine the target achievement signal as the fifth counting signal and determine the target clock cycle count value as the first value. Alternatively, the selection module 42 is further configured to: responsive to that the first config signal indicates that at least one of the AL and the PL is turned on, determine the target achievement signal as the sixth counting signal and determine the target clock cycle count value as the second value.

It further needs to be noted that, when neither the AL nor the PL is turned on, in this case, the target clock cycle count value (that is, the first value) is a value greater than or equal to 18. When at least one of the AL and the PL is turned on, in this case, the target clock cycle count value (that is, the second value) is a value greater than or equal to 57. In addition, when the fifth counting signal is changed to a high level (that is, "1"), in this case, the clock cycle count value reaches 32. When the sixth counting signal is changed to a high level (that is, is "1"), in this case, the clock cycle count value reaches 64. Therefore, in a specific example, the first value may be 32, and the second value may be 64.

Figure 7:
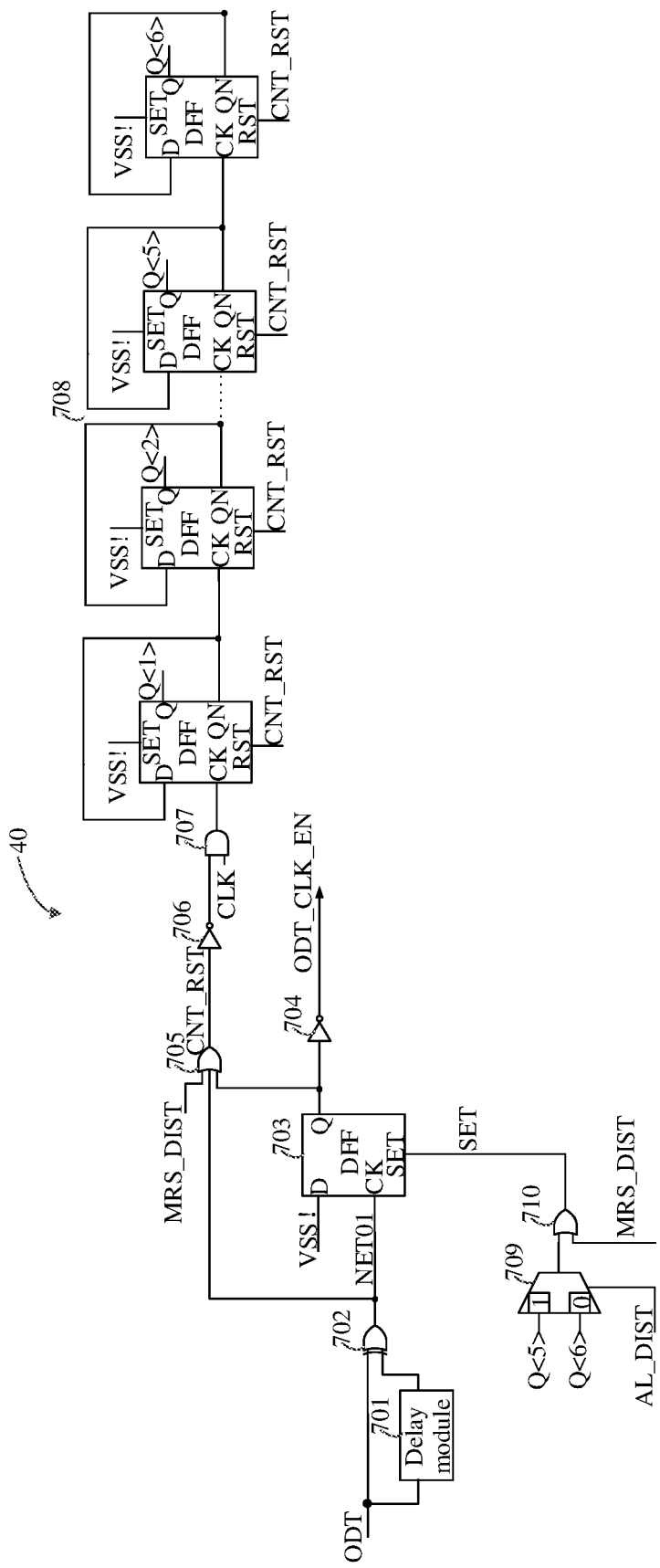
FIG. 7 is a specific schematic structural diagram of an enable control circuit according to an embodiment of the disclosure.

For example, FIG. 7 is a specific schematic structural diagram of the enable control circuit 40 according to an embodiment of the disclosure. As shown in FIG. 7, the enable control circuit 40 may include a delay module 701, an XOR gate 702, a first flip-flop 703, a first NOT gate 704, a 3-input OR gate 705, a second NOT gate 706, a 2-input AND gate 707, an asynchronous binary counter 708, a selection module 709, and a 2-input OR gate 710. For a specific connection relationship, reference may be made to FIG. 7 for details. The first flip-flop 703 is a DFF. The asynchronous binary counter 708 may include six second flip-flops. Each second flip-flop may also be a DFF. In addition, an input terminal (D) of each second flip-flop is connected to a second output terminal (QN) of the second flip-flop, and the second output terminal (QN) of the second flip-flop is connected to a clock terminal (CK) of a next second flip-flop.

In FIG. 7, an ODT pin signal is represented by ODT. A first intermediate signal outputted by the XOR gate 702 is represented by NET01. An ODT enable signal outputted by the first NOT gate 704 is represented by ODT_CLK_EN. A counting reset signal outputted by the 3-input OR gate 705 is represented by CNT_RST. Counting signals outputted by first output terminals (Q) of the six second flip-flops are sequentially represented by Q<1>, Q<2>, . . . , Q<5>, and Q<6>. In addition, CLK indicates a clock signal, SET indicates the first set signal, AL_DIST indicates the first config signal, MRS_DIST indicates the second config signal, and VSS! indicates a global ground signal.

Figure 8:
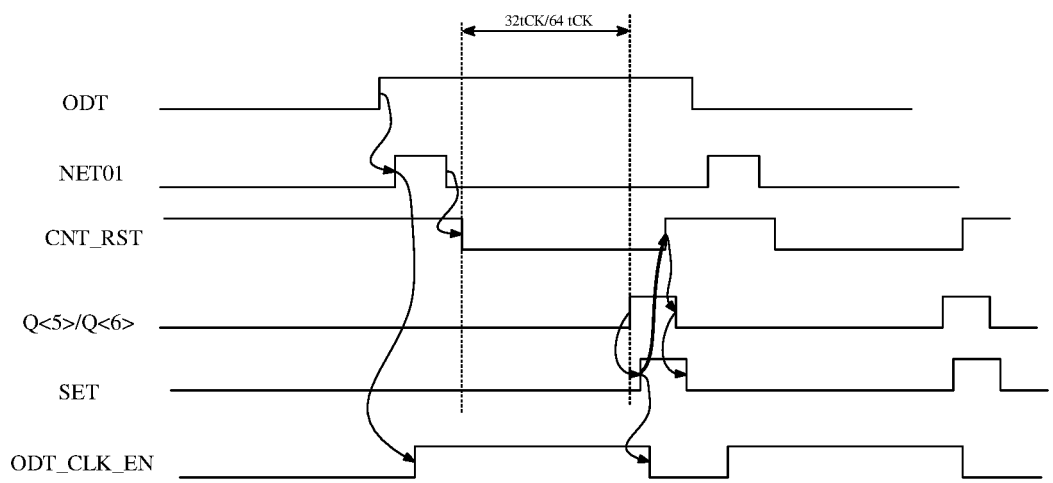
FIG. 8 is a schematic timing diagram of an enable control circuit according to an embodiment of the disclosure.

In this way, according to a circuit structure shown in FIG. 7, a signal timing diagram corresponding to the circuit structure is shown in FIG. 8. In FIG. 8, an arrowed curve indicates a causation relationship. Specifically, when the ODT pin signal is changed from a low level to a high level, after being delayed by the delay module 701, the ODT pin signal is still at a low level. In this case, after the two ODT pin signals at a high level and a lower level are inputted into the XOR gate 702, a signal at a high level is outputted. That is, the signal NET01 is changed from a low level to a high level. The reason why the signal ODT_CLK_EN is changed from a low level to a high level is that the first flip-flop 703 (that is, the DFF) is triggered at the instant when the signal NET01 is changed from a low level to a high level. An input of a D end is used as an output of a Q end. In this case, the output of the Q end is at a low level. After passing through the first NOT gate 704, the signal ODT_CLK_EN is changed to a high level. That is, the signal ODT_CLK_EN is changed from a low level to a high level, so that the ODT path is in an enabled state.

In addition, in a case that the signal MRS_DIST is at a low level, when the signal NET01 is changed from a high level to a low level, because the output of the Q end of the first flip-flop 703 is at a low level, after the signal MRS_DIST at a low level, the signals NET01 at a low level and the output of the Q end of the first flip-flop 703 a low level are inputted into the 3-input OR gate 705, a signal at a low level is outputted. That is, the signal CNT_RST is changed from a high level to a low level. In this case, the asynchronous binary counter 708 starts counting. For example, the target clock cycle count value is 32tck. After a clock cycle is counted to 32tck, a count value changes to 010000. In this case, the signal Q<5> is changed from a low level to a high level. In a case that neither the AL nor the PL is turned on and AL_DIST is at a high level, because the signal Q<5> is at a high level, the selection module 709 outputs a signal at a high level. After the output signal at a high level and the signal MRS_DIST are inputted into the 2-input OR gate 710, a signal at a high level is outputted. That is, the signal SET is changed from a low level to a high level. Alternatively, for example, the target clock cycle count value is 64tck, after the clock cycle is counted to 64 tck, the count value changes to 100000. In this case, the signal Q<6> is changed from a low level to a high level. In a case that at least one of the AL and the PL is turned on, AL_DIST is at a low level. Because the signal Q<6> is at a high level, the selection module 709 outputs a signal at a high level. After the output signal at a high level and the signal MRS_DIST are inputted into the 2-input OR gate 710, a signal at a high level is outputted. That is, the signal SET may also be changed from a low level to a high level.

Further, when the signal SET is at a high level, the first flip-flop 703 is set, so that the output of the Q end of the first flip-flop 703 is a high level. In one aspect, when the output of the Q end of the first flip-flop 703 is a high level, after passing through the 3-input OR gate 705, the signal CNT_RST may be changed from a low level to a high level, so that the asynchronous binary counter 708 and an internal clock signal of the asynchronous binary counter can be disabled, to enable the signal Q<5> to be changed from a high level to a low level. Because the signal Q<5> is at a low level and the signal MRS_DIST is at a low level, after the signal Q<5> and the signal MRS_DIST are inputted into the 2-input OR gate 710, the signal SET is changed from a high level to a low level. In another aspect, when the output of the Q end of the first flip-flop 703 is a high level, the high level is changed to a low level after the signal passes through the first NOT gate 704. That is, the signal ODT_CLK_EN is changed from a high level to a low level, so that the ODT path is in the disabled state, thereby implementing power saving.

It needs to be noted that, the circuit structure shown in FIG. 7 is to generate an enable signal ODT_CLK_EN of the ODT path. When a level state of ODT_CLK_EN is a high level, the clock signal of the ODT path may be enabled, to enable the ODT path. When the level state of ODT_CLK_EN is a low level, the clock signal of the ODT path is disabled, thereby the ODT path is disabled.

It further needs to be noted that, if the level state of MRS_DIST is a high level, it indicates that an ODT function may be disabled by using an MRS. That is, a signal level state at an ODT pin is not working. In this case, the level state of ODT_CLK_EN is at a low level, so that an ODT function in the related art is implemented. In addition, because the level state of CNT_RST is a high level, the asynchronous binary counter 708 and the internal clock signal of the asynchronous binary counter may be further disabled, so that current in the circuit can be reduced. In addition, the delay module 701 may control a pulse width of NET01.

Relationships between an ODT latency and the CWL, the AL, and the PL can be known based on the foregoing content. To ensure the ODT latency, a time period within which the level state of ODT_CLK_EN is a high level needs to ensure that the ODT path completes a shift of the ODT latency. In a case that neither the AL nor the PL is turned on, the CWL may be 20 at most (DDR4 specifications). Therefore, it may be set that after the asynchronous binary counter 708 counts to 32 clock cycles, the level state of ODT_CLK_EN is changed to a low level, to disable the clock signal of the ODT path. In a case that at least one of the AL and the PL is turned on, it is considered AL=31, PL=8, and CWL=20 at most. Therefore, it may be set that after the asynchronous binary counter 708 counts to 64 clock cycles, the level state of ODT_CLK_EN is changed to a low level, to disable the clock signal of the ODT path. In this way, it is ensured that the timing of the ODT path can be implemented, and a time for which the clock signal of the ODT path oscillates is reduced, thereby reducing current consumed by the ODT path.

In addition, in FIG. 7, the internal clock signal used by the asynchronous binary counter 708 is also controlled by the signal CNT_RST. After counting ends, because the signal CNT_RST is at a high level, the internal clock signal used by the asynchronous binary counter 708 is also disabled, to enable the current consumed by the 2-input AND gate 707 to be reduced, so that the current can be further reduced.

Specific implementations of the foregoing embodiments are described in detail by using this embodiment. As can be seen, by using the technical solutions in the foregoing embodiments, it can be implemented that after it is detected that a level state of an ODT pin changes, the ODT path is enabled and maintains at the enabled for a particular time period (that is, the ODT path is in the enabled state). After it is ensured that the resistance value of the RTT has changed, the ODT path may be further disabled, so that the current can be reduced, and power consumption can be reduced.

Figure 9:
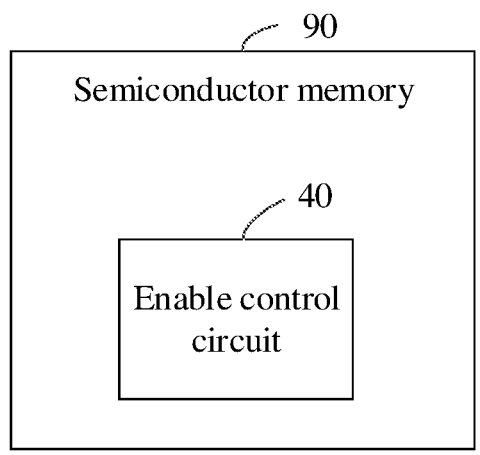
FIG. 9 is a schematic structural diagram of a semiconductor memory according to an embodiment of the disclosure.

In still another embodiment of the disclosure, FIG. 9 is a schematic structural diagram of a semiconductor memory 90 according to an embodiment of the disclosure. As shown in FIG. 9, the semiconductor memory 90 may include enable control circuit 40 described in any one of the foregoing embodiments.

In the embodiments of the disclosure, the semiconductor memory 90 may be a DRAM chip.

Further, in some embodiments, the DRAM chip meets DDR4 memory specifications.

In the embodiments of the disclosure, the enable control circuit 40 especially relates to enable control of an ODT path in a DDR4 DRAM chip. The enable control circuit 40 may generate an enable signal, and a clock signal of the ODT path is controlled to implement power saving.

Specifically, because the semiconductor memory 90 includes the enable control circuit 40, in this way, an enabled state of the ODT path is controlled according to whether the clock cycle count value reaches the target clock cycle count value, and it can also be implemented that after it is detected that a level state of an ODT pin is changed, the ODT path is enabled and maintains at the enabled state for a particular time period (that is, the ODT path is in an enabled state). After it is ensured that the resistance value of the RTT has changed, the ODT path may be further disabled, so that current can be reduced, and power consumption can be reduced.

The foregoing is merely preferred embodiments of the disclosure but is not used to limit the scope of protection of the disclosure.

It should be noted that the terms "include", "comprise", or any variation thereof in the disclosure are intended to cover a non-exclusive inclusion. Therefore, in the context of a process, method, object or apparatus that includes a series of elements, the process, method, object or apparatus not only includes such elements, but also includes other elements not specified expressly, or may include inherent elements of the process, method, object or apparatus. If no more limitations are made, an element limited by "include a/an . . . " does not exclude other same elements existing in the process, the method, the object or the apparatus which includes the element.

The foregoing sequence numbers of the embodiments of the disclosure are merely for the convenience of description, and do not imply the preference among the embodiments.

The methods disclosed in several method embodiments provided in the disclosure may be arbitrarily combined with each other without causing any conflict to obtain new method embodiments.

The features disclosed in several product embodiments provided in the disclosure may be arbitrarily combined with each other without causing any conflict to obtain new product embodiments.

The features disclosed in several method or device embodiments provided in the disclosure may be arbitrarily combined with each other without causing any conflict to obtain new method embodiments or device embodiments.

The foregoing descriptions are merely specific implementations of the disclosure, but are not intended to limit the scope of protection of the disclosure. Any variation or replacement that may be readily figured out by a person skilled in the art within the technical scope disclosed in the disclosure shall fall within the scope of protection of the disclosure. Therefore, the scope of protection of the disclosure shall be subject to the scope of protection of the claims.

In the embodiments of the disclosure, the enable control circuit includes a counting module, a selection module, and a control module. The counting module is configured to: count past clock cycles, and determine a clock cycle count value. The selection module is configured to determine a target clock cycle count value according to a first config signal. The control module is connected to the counting module and the selection module, and is configured to: control an ODT path to be in an enabled state responsive to a level state of an ODT pin signal being inverted, and start the counting module; and control the ODT path to switch from the enabled state to a disabled state when the clock cycle count value reaches the target clock cycle count value. In this way, an enabled state of the ODT path is controlled according to whether the clock cycle count value reaches the target clock cycle count value, to control the ODT path to be disabled when the operation of the ODT path is not required, so that a waste of current can be avoided and power consumption can be reduced.

The invention claimed is:

1. An enable control circuit, comprising:
   a counting circuit, configured to: count past clock cycles, and determine a clock cycle count value;
   a selection circuit, configured to determine a target clock cycle count value according to a first config signal; and
   a control circuit, connected to the counting circuit and the selection circuit, and configured to: control an On Die Termination (ODT) path to be in an enabled state responsive to a level state of an ODT pin signal being inverted, and start the counting circuit; and control the ODT path to switch from the enabled state to a disabled state when the clock cycle count value reaches the target clock cycle count value;
   wherein the control circuit comprises a first control subcircuit and a second control subcircuit, wherein
      the first control subcircuit is configured to generate a first intermediate signal according to the ODT pin signal, wherein the first intermediate signal comprises: before the level state of the ODT pin signal is inverted, the first intermediate signal is at a first level; after the level state of the ODT pin signal is inverted, the first intermediate signal is switched from the first level to a second level and maintains at the second level for a preset time period; and after the preset time period, the first intermediate signal is switched from the second level to the first level; and the second control subcircuit is configured to perform a logical operation on the first intermediate signal to generate an ODT enable signal, wherein the ODT enable signal is configured to: control the ODT path to be in the enabled state when the ODT enable signal is at a third level; and control the ODT path to be in the disabled state when the ODT enable signal is at a fourth level;

wherein the first control subcircuit comprises a delay circuit and an XOR gate circuit, wherein the delay circuit is configured to delay the ODT pin signal by the preset time period to obtain a delayed ODT signal; and the XOR gate circuit is configured to perform an XOR operation on the ODT pin signal and the delayed ODT signal to obtain the first intermediate signal.

2. The enable control circuit according to claim 1, wherein the first level is a low level, the second level is a high level, the third level is the high level, and the fourth level is the low level.

3. The enable control circuit according to claim 1, wherein the second control subcircuit comprises a first flip-flop and a first NOT gate circuit, wherein the first flip-flop is a Data Flip-Flop (DFF), and a clock terminal (CK) of the first flip-flop is connected to an output terminal of the first control subcircuit, and is configured to receive the first intermediate signal; an input terminal (D) of the first flip-flop is connected to a ground terminal, and an output terminal (Q) of the first flip-flop is configured to output a second intermediate signal; and the first NOT gate circuit is configured to: receive the second intermediate signal, and perform a NOT operation on the second intermediate signal to obtain the ODT enable signal.

4. The enable control circuit according to claim 3, wherein the first flip-flop further comprises a set terminal (SET), wherein the set terminal is configured to: receive a first set signal, and control the ODT enable signal to be at a low level by setting the first flip-flop when the first set signal is at a high level.

5. The enable control circuit according to claim 4, wherein the control circuit further comprises a 2-input OR gate, wherein the selection circuit is further configured to generate a target achievement signal, wherein the target achievement signal indicates that the clock cycle count value reaches the target clock cycle count value; and the 2-input OR gate is configured to perform an OR operation on the target achievement signal and a second config signal to obtain the first set signal, wherein the second config signal is generated according to a setting of a mode register (MR), and the second config signal is configured to: indicate that an ODT function of a chip is disabled when the second config signal is at a fifth level; and indicate that the ODT function of the chip is enabled when the second config signal is at a sixth level.

6. The enable control circuit according to claim 5, wherein the fifth level is the high level, and the sixth level is the low level.

7. The enable control circuit according to claim 5, wherein the control circuit further comprises a 3-input OR gate, wherein the 3-input OR gate is configured to perform an OR operation on the second config signal, the first intermediate signal, and the second intermediate signal to generate a counting reset signal.

8. The enable control circuit according to claim 7, wherein the counting circuit comprises an asynchronous binary counter, the asynchronous binary counter comprises a plurality of second flip-flops, and the plurality of second flip-flops are connected in sequence;

wherein each second flip-flop of the plurality of second flip-flops is a second DFF, an input terminal (D) of each second flip-flop is connected to a second output terminal (Q-NON) of the second flip-flop, and the second output terminal (Q-NON) of the second flip-flop is connected to a clock terminal (CK) of a next second flip-flop.

9. The enable control circuit according to claim 8, wherein the second flip-flop further comprises a first output terminal (Q) and a reset terminal (RST), wherein the first output terminal of the second flip-flop is configured to output a counting signal; and the reset terminal of the second flip-flop is configured to: receive the counting reset signal, and control the counting signal to be at the low level by resetting the second flip-flop when the counting reset signal is at the high level.

10. The enable control circuit according to claim 9, wherein the counting circuit further comprises a clock control circuit, wherein the clock control circuit is configured to: receive the counting reset signal and a clock signal, and generate an internal clock signal, wherein the internal clock signal is connected to a clock terminal (CK) of a first second flip-flop in the plurality of second flip-flops, and the internal clock signal is configured to: stop outputting the internal clock signal when the counting reset signal is at a seventh level; and output the internal clock signal when the counting reset signal is at an eighth level.

11. The enable control circuit according to claim 10, wherein the seventh level is the high level, and the eighth level is the low level.

12. The enable control circuit according to claim 10, wherein the clock control circuit comprises a second NOT gate circuit and a 2-input AND gate, wherein the second NOT gate circuit is configured to: receive the counting reset signal, and perform a NOT operation on the counting reset signal to obtain a third intermediate signal; and the 2-input AND gate is configured to: receive the third intermediate signal and the clock signal, and perform an AND operation on the third intermediate signal and the clock signal to obtain the internal clock signal.

13. The enable control circuit according to claim 5, wherein the selection circuit is further configured to: receive the first config signal and at least two indication signals, and select one of the at least two indication signals as the target achievement signal according to the first config signal, wherein the at least two indication signals indicate that the clock cycle count value reaches different target clock cycle count values respectively.

14. The enable control circuit according to claim 13, wherein
the selection circuit is configured to: responsive the first config signal indicating that neither an Additive Latency (AL) nor a Parity Latency (PL) is turned on, select a first indication signal as the target achievement signal and determine that the target clock cycle count value is a first value, wherein the first value is greater than or equal to a value obtained by subtracting 2 from a column address write latency (CWL);
the selection circuit is configured to: responsive to the first config signal indicating that both the AL and the PL are turned on, select a second indication signal as the target achievement signal and determine that the target clock cycle count value is a second value, wherein the second value is greater than or equal to a value obtained by subtracting 2 from a sum of the CWL, the AL, and the PL;
the selection circuit is configured to: responsive to the first config signal indicating that the AL is turned on and the PL is not turned on, select a third indication signal as the target achievement signal and determine that the target clock cycle count value is a third value, wherein the third value is greater than or equal to a value obtained by subtracting 2 from a sum of the CWL and the AL; or
the selection circuit is configured to: responsive to the first config signal indicating that the PL is turned on and the AL is not turned on, select a fourth indication signal as the target achievement signal and determine that the target clock cycle count value is a fourth value, wherein the fourth value is greater than or equal to a value obtained by subtracting 2 from a sum of the CWL and the PL,
wherein the first indication signal indicates that the clock cycle count value reaches the first value, the second indication signal indicates that the clock cycle count value reaches the second value, the third indication signal indicates that the clock cycle count value reaches the third value, and the fourth indication signal indicates that the clock cycle count value reaches the fourth value.

15. The enable control circuit according to claim 14, wherein the counting circuit comprises six second flip-flops, and the six second flip-flops are connected in sequence, wherein
a first output terminal of an $i^{th}$ second flip-flop of the six second flip-flops is configured to output an $i^{th}$ counting signal, wherein i is an integer greater than 0 and less than or equal to 6; and
the selection circuit is configured to: receive the first config signal, a fifth counting signal, and a sixth counting signal, and perform selection on the fifth counting signal and the sixth counting signal according to the first config signal to generate the target achievement signal, wherein two input terminals of the selection circuit are respectively connected to a first output terminal of a fifth second flip-flop of the six second flip-flops and a first output terminal of a sixth second flip-flop of the six second flip-flops.

16. The enable control circuit according to claim 15, wherein
the selection circuit is further configured to: responsive to the first config signal indicating that neither the AL nor the PL is turned on, determine the target achievement signal as the fifth counting signal and determine the target clock cycle count value as the first value; or,
the selection circuit is further configured to: responsive to the first config signal indicating that at least one of the AL or the PL is turned on, determine the target achievement signal as the sixth counting signal and determine the target clock cycle count value as the second value, wherein the first value is 32, and the second value is 64.

17. A semiconductor memory, comprising:
an enable control circuit, comprising:
a counting circuit, configured to: count past clock cycles, and determine a clock cycle count value;
a selection circuit, configured to determine a target clock cycle count value according to a first config signal; and
a control circuit, connected to the counting circuit and the selection circuit, and configured to: control an On Die Termination (ODT) path to be in an enabled state responsive to a level state of an ODT pin signal being inverted, and start the counting circuit; and control the ODT path to switch from the enabled state to a disabled state when the clock cycle count value reaches the target clock cycle count value;
wherein the control circuit comprises a first control subcircuit and a second control subcircuit, wherein
the first control subcircuit is configured to generate a first intermediate signal according to the ODT pin signal, wherein the first intermediate signal comprises: before the level state of the ODT pin signal is inverted, the first intermediate signal is at a first level; after the level state of the ODT pin signal is inverted, the first intermediate signal is switched from the first level to a second level and maintains at the second level for a preset time period; and after the preset time period, the first intermediate signal is switched from the second level to the first level; and
the second control subcircuit is configured to perform a logical operation on the first intermediate signal to generate an ODT enable signal, wherein the ODT enable signal is configured to: control the ODT path to be in the enabled state when the ODT enable signal is at a third level; and control the ODT path to be in the disabled state when the ODT enable signal is at a fourth level;
wherein the first control subcircuit comprises a delay circuit and an XOR gate circuit, wherein
the delay circuit is configured to delay the ODT pin signal by the preset time period to obtain a delayed ODT signal; and
the XOR gate circuit is configured to perform an XOR operation on the ODT pin signal and the delayed ODT signal to obtain the first intermediate signal.

18. The semiconductor memory according to claim 17, wherein the semiconductor memory is a Dynamic Random Access Memory (DRAM) chip, and the DRAM chip meets 4th Double Data Rate (DDR4) memory specifications.

19. An enable control circuit, comprising:
a counting circuit, configured to: count past clock cycles, and determine a clock cycle count value;
a selection circuit, configured to determine a target clock cycle count value according to a first config signal; and a control circuit, connected to the counting circuit and the selection circuit, and configured to: control an On Die Termination (ODT) path to be in an enabled state responsive to a level state of an ODT pin signal being inverted, and start the counting circuit; and control the ODT path to switch from the enabled state to a disabled state when the clock cycle count value reaches the target clock cycle count value;

wherein the control circuit comprises a first control subcircuit and a second control subcircuit, wherein
the first control subcircuit is configured to generate a first intermediate signal according to the ODT pin signal, wherein the first intermediate signal comprises: before the level state of the ODT pin signal is inverted, the first intermediate signal is at a first level; after the level state of the ODT pin signal is inverted, the first intermediate signal is switched from the first level to a second level and maintains at the second level for a preset time period; and after the preset time period, the first intermediate signal is switched from the second level to the first level; and
the second control subcircuit is configured to perform a logical operation on the first intermediate signal to generate an ODT enable signal, wherein the ODT enable signal is configured to: control the ODT path to be in the enabled state when the ODT enable signal is at a third level; and control the ODT path to be in the disabled state when the ODT enable signal is at a fourth level;

wherein the second control subcircuit comprises a first flip-flop and a first NOT gate circuit, wherein
the first flip-flop is a Data Flip-Flop (DFF), and a clock terminal (CK) of the first flip-flop is connected to an output terminal of the first control subcircuit, and is configured to receive the first intermediate signal; an input terminal (D) of the first flip-flop is connected to a ground terminal, and an output terminal (Q) of the first flip-flop is configured to output a second intermediate signal; and
the first NOT gate circuit is configured to: receive the second intermediate signal, and perform a NOT operation on the second intermediate signal to obtain the ODT enable signal.

* * * * *